US012753507B2

(12) United States Patent
Yamaguchi et al.

(10) Patent No.: US 12,753,507 B2
(45) Date of Patent: Oct. 6, 2026

(54) SUBSTRATE PROCESSING APPARATUS

(71) Applicant: Tokyo Electron Limited, Tokyo (JP)

(72) Inventors: Tatsuya Yamaguchi, Nirasaki City (JP); Syuji Nozawa, Nirasaki City (JP)

(73) Assignee: Tokyo Electron Limited, Tokyo (JP)

( * ) Notice: Subject to any disclaimer, the term of this patent is extended or adjusted under 35 U.S.C. 154(b) by 622 days.

(21) Appl. No.: 17/820,637

(22) Filed: Aug. 18, 2022

(65) Prior Publication Data

US 2023/0067094 A1 Mar. 2, 2023

(30) Foreign Application Priority Data

Aug. 30, 2021 (JP) ................................ 2021-140463

(51) Int. Cl.
*C23C 16/458* (2006.01)
*B05D 1/00* (2006.01)
(Continued)

(52) U.S. Cl.
CPC ............ *C23C 16/4585* (2013.01); *B05D 1/60* (2013.01); *C23C 16/4412* (2013.01);
(Continued)

(58) Field of Classification Search
CPC . B05D 1/60; B05D 2401/33; H01J 37/32449; H01J 37/32513; H01J 37/32568; H01J 37/32633; H01J 37/32642; H01J 37/32715; H01J 37/32834; H01J 37/32816; H01L 21/68714; H01L 21/68735; H01L 21/68764; H01L 21/6875; C23C 16/45517; C23C 16/45561; C23C 16/45565; C23C 16/45574; C23C 16/45591; C23C 16/4583; C23C 16/4585
See application file for complete search history.

(56) References Cited

U.S. PATENT DOCUMENTS 6,106,625 A * 8/2000 Koai .................... C23C 16/455 118/724
6,736,945 B2 * 5/2004 Ishida .................... C25D 17/06 204/278
(Continued)

FOREIGN PATENT DOCUMENTS

JP 2013-067844 A 4/2013
JP 2015-183211 A 10/2015
(Continued)

*Primary Examiner* — Gordon Baldwin
*Assistant Examiner* — Todd M Seoane
(74) *Attorney, Agent, or Firm* — Armstrong Teasdale LLP

(57) ABSTRACT

A substrate processing apparatus including: a processing container; a stage installed in the processing container and configured to place a substrate thereon; a ceiling plate installed at a position facing the stage in the processing container; a driver configured to raise and lower the stage; an exhaust port formed in a side wall of the processing container and configured to exhaust a gas in the processing container; and a controller configured to control conductance of a space between the exhaust port and a processing space between the stage and the ceiling plate by controlling the driver to adjust a distance between a peripheral edge portion of the stage and a facing member disposed at a position facing the peripheral edge portion in the processing container.

12 Claims, 11 Drawing Sheets

(51) Int. Cl.

| | |
|---|---|
| ***C23C 16/44*** | (2006.01) |
| ***C23C 16/455*** | (2006.01) |
| ***C23C 16/505*** | (2006.01) |
| ***H01J 37/32*** | (2006.01) |
| ***H10P 72/76*** | (2026.01) |

(52) U.S. Cl.

CPC .... *H01J 37/32715* (2013.01); *H10P 72/7611* (2026.01); *B05D 2401/33* (2013.01); *C23C 16/45565* (2013.01); *C23C 16/505* (2013.01)

(56) References Cited

U.S. PATENT DOCUMENTS

| | | | | |
|---|---|---|---|---|
| 8,551,890 | B2 * | 10/2013 | Goodlin | C23C 16/45565 438/758 |
| 2007/0166655 | A1 * | 7/2007 | Ooshima | H01L 21/67017 432/120 |
| 2009/0255631 | A1 * | 10/2009 | Sato | H01J 37/3244 156/345.43 |
| 2010/0279008 | A1 * | 11/2010 | Takagi | C23C 16/45565 118/725 |
| 2015/0187613 | A1 * | 7/2015 | Wakiyama | H01L 21/6715 134/95.1 |
| 2018/0112309 | A1 * | 4/2018 | Kamio | C23C 16/45544 |
| 2019/0287843 | A1 * | 9/2019 | Yahata | C23C 16/45544 |
| 2020/0010956 | A1 * | 1/2020 | Toriya | C23C 16/448 |
| 2020/0048764 | A1 * | 2/2020 | Kuwada | C23C 16/45544 |
| 2020/0066493 | A1 * | 2/2020 | Noorbakhsh | H01J 37/32385 |

FOREIGN PATENT DOCUMENTS

| | | | | |
|---|---|---|---|---|
| JP | 2019-218616 | A | 12/2019 | |
| JP | 2021-025087 | A | 2/2021 | |
| KR | 20190051291 | A * | 5/2019 | H05H 1/46 |
| WO | 2008129925 | A1 | 10/2008 | |

* cited by examiner

SUBSTRATE PROCESSING APPARATUS

CROSS-REFERENCE TO RELATED APPLICATION

This application is based upon and claims the benefit of priority from Japanese Patent Application No. 2021-140463, filed on Aug. 30, 2021, the entire contents of which are incorporated herein by reference.

TECHNICAL FIELD

Various aspects of embodiments of the disclosure relate to a substrate processing apparatus.

BACKGROUND

There is known a technique of forming an organic film on a target substrate by a polymerization reaction of two types of monomers by supplying a gas including the two types of monomers into a processing container in which the target substrate is accommodated. For example, there is known a technique for forming a polymer film on a target substrate by a vacuum deposition polymerization reaction of an aromatic alkyl-, alicyclic-, or aliphatic diisocyanate monomer and an aromatic alkyl-, alicyclic-, or aliphatic diamine monomer (see, for example, Patent Document 1).

PRIOR ART DOCUMENT

Patent Document

Patent Document 1: International Publication No. WO 2008/129925

SUMMARY

According to one embodiment of the present disclosure, there is provided a substrate processing apparatus including: a processing container; a stage installed in the processing container and configured to place a substrate thereon; a ceiling plate installed at a position facing the stage in the processing container; a driver configured to raise and lower the stage; an exhaust port formed in a side wall of the processing container and configured to exhaust a gas in the processing container; and a controller configured to control conductance of a space between the exhaust port and a processing space between the stage and the ceiling plate by controlling the driver to adjust a distance between a peripheral edge portion of the stage and a facing member disposed at a position facing the peripheral edge portion in the processing container.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of a substrate processing apparatus according to the present disclosure will be described in detail based on the drawings. The substrate processing apparatus disclosed herein are not limited by the following embodiments.

Ensuring that the gas supplied in the processing container is evenly distributed over an entire substrate is one of the important factors for improving the uniformity of processing of the substrate. Therefore, in some cases, in order to ensure that the gas in the processing container is not unevenly distributed in the processing container, an attempt is made to evenly exhaust the gas by providing a slit-shaped exhaust port in the side wall of the processing container in which a substrate is accommodated to surround the periphery of the substrate, and exhausting the gas in the processing container from the exhaust port.

However, when the amount of gas exhausted from an exhaust port is large, the exhaust port located closer to the exhaust pump exhausts more gas than the exhaust port located far from the exhaust pump. Therefore, it is difficult to uniformly exhaust the gas. For these reasons, it is conceivable to reduce the amount of gas exhausted from the exhaust port by narrowing the opening of the slit-shaped exhaust port to lower the conductance of the exhaust port. However, the size of the opening of the exhaust port may deviate from a design value due to manufacturing error, assembly error, thermal expansion, and the like. It is difficult to make the size of the opening of the exhaust port as the design value because the amount of gas exhausted from the exhaust port changes greatly even when the size of the opening of the exhaust port changes slightly.

Therefore, the present disclosure provides a technique capable of improving the uniformity of processing on a substrate.

[Configuration of Substrate Processing Apparatus 10]

Figure 1:
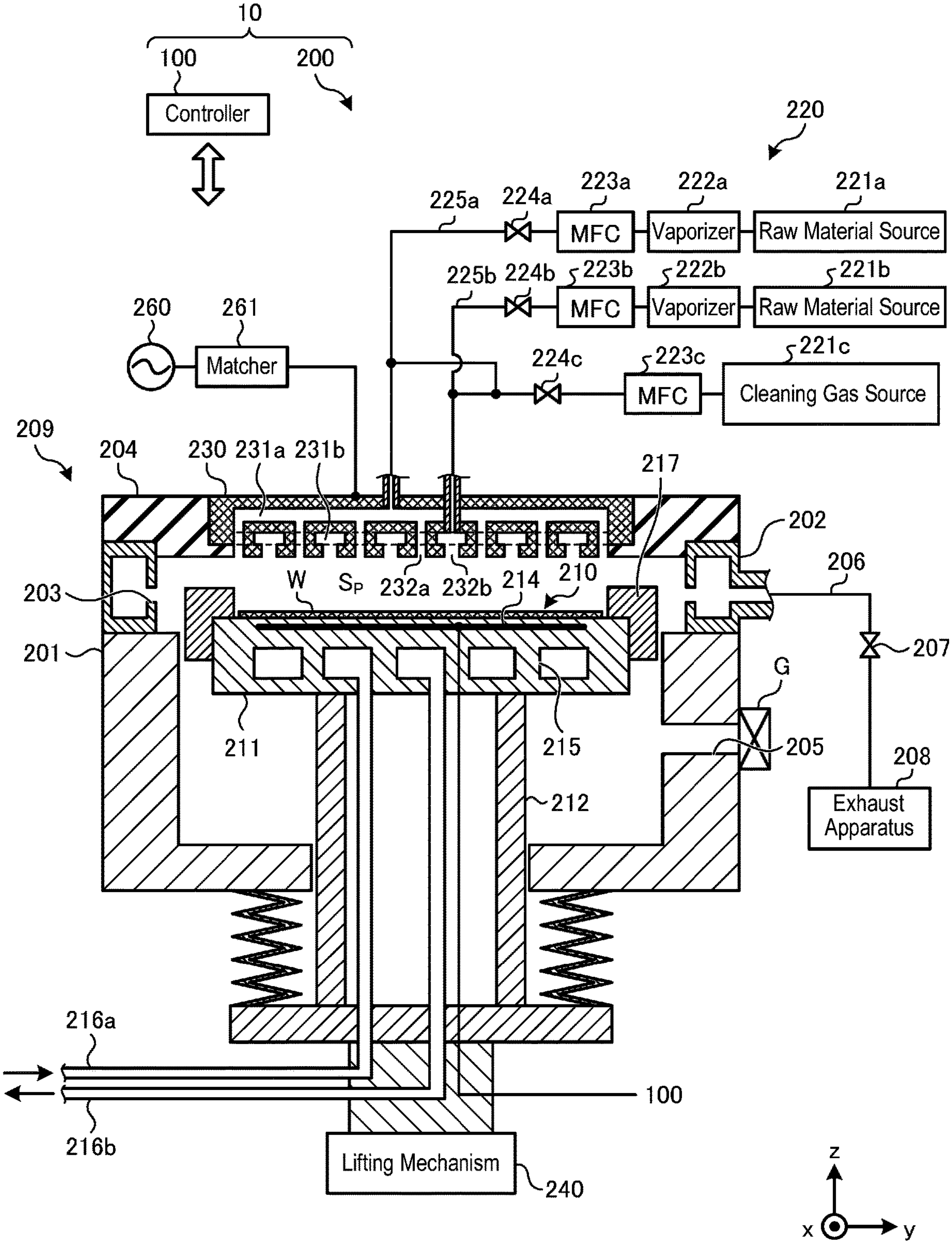
FIG. 1 is a schematic cross-sectional view illustrating an example of a substrate processing apparatus according to an embodiment of the present disclosure.

FIG. 1 is a schematic cross-sectional view illustrating an example of a substrate processing apparatus 10 according to an embodiment of the present disclosure. The substrate processing apparatus 10 includes an apparatus main body 200 and a controller 100 that controls the apparatus main body 200. The apparatus main body 200 includes a processing container 209. The processing container 209 includes a lower container 201, an exhaust duct 202, a support structure 210, and a shower head 230.

The lower container 201 is made of a metal such as aluminum. The exhaust duct 202 is installed on the upper peripheral edge of the lower container 201. In addition, an annular insulating member 204 is disposed on the exhaust duct 202. The shower head 230 is installed above the lower container 201 and supported by the insulating member 204. The shower head 230 is an example of the ceiling plate. A support structure 210 on which a substrate W is placed is installed substantially in the center of the lower container 201. Hereinbelow, the space in the processing container 209 surrounded by the lower container 201, the exhaust duct 202, the support structure 210, and the shower head 230 is defined as a processing space $S_P$.

In addition, an opening 205 is formed in the side wall of the lower container 201 so that carry-in/out of a substrate W is performed therethrough. The opening 205 is opened and closed by a gate valve G. The exhaust duct 202 has a hollow square shape in a vertical cross section, and extends in an annular shape along the upper peripheral edge of the lower container 201. In the exhaust duct 202, a slit-shaped exhaust port 203 is formed along the extension direction of the exhaust duct 202. The exhaust port 203 is disposed outside a substrate W region along the peripheral edge of the substrate W placed on the support structure 210, and exhausts the gas in the processing space $S_P$.

One end of an exhaust pipe 206 is connected to the exhaust duct 202. The other end of the exhaust pipe 206 is connected to an exhaust apparatus 208 having a vacuum pump or the like via a pressure adjustment valve 207 such as an auto pressure controller (APC) valve. The pressure adjustment valve 207 is controlled by the controller 100, and controls the pressure inside the processing space $S_P$ to a preset pressure.

A heater (not illustrated) is installed on the side wall of the exhaust duct 202 and the top surface of the shower head 230, and the exhaust duct 202 and the shower head 230 are heated to a temperature of, for example, 200 degrees C. or higher. This makes it possible to suppress the adhesion of reaction by-products (so-called deposits) to the exhaust duct 202 and the shower head 230. The exhaust pipe 206, the pressure adjustment valve 207, and the exhaust apparatus 208 may also be installed with a heater and heated to a temperature at which the deposits are unlikely to adhere.

The support structure 210 includes a stage 211 and a support 212. The stage 211 is made of a metal such as aluminum, and a substrate W is placed on the top surface thereof. The shower head 230 is installed at a position corresponding to the stage 211. An annular cover member 217 is installed outside the region of the stage 211 on which a substrate W is placed. The support 212 is made of a metal such as aluminum in a tubular shape, and supports the stage 211 from below.

A heater 214 is embedded in the stage 211. The heater 214 heats the substrate W placed on the stage 211 depending on the power supplied thereto. The power supplied to the heater 214 is controlled by the controller 100.

A flow path 215 through which a coolant flows is formed in the stage 211. A chiller unit (not illustrated) is connected to the flow path 215 via a pipe 216*a* and a pipe 216*b*. A coolant adjusted to a predetermined temperature by the chiller unit is supplied to the flow path 215 via the pipe 216*a*, and the coolant circulating in the flow path 215 is returned to the chiller unit via the pipe 216*b*. The stage 211 is cooled by the coolant circulating in the flow path 215. The chiller unit is controlled by the controller 100.

The support 212 is arranged within the lower container 201 to penetrate an opening formed in the bottom portion of the lower container 201. The support 212 is raised and lowered through the driving of a lifting mechanism 240. At the time of carry-in of a substrate W, the support structure 210 is lowered by driving the lifting mechanism 240, and the gate valve G is opened. Then, the substrate W is carried into the lower container 201 through the opening 205 and placed on the stage 211. Then, the gate valve G is closed, the support structure 210 is raised through the driving of the lifting mechanism 240, and the film forming process is performed on the substrate W. At the time of carry-out of the substrate W, the support structure 210 is lowered by driving the lifting mechanism 240, and the gate valve G is opened. Then, the substrate W is carried out from the stage 211 through the opening 205.

The shower head 230 has a diffusion chamber 231*a* and a diffusion chamber 231*b*. The diffusion chamber 231*a* and the diffusion chamber 231*b* do not communicate with each other. A gas supplier 220 is connected to the diffusion chamber 231*a* and the diffusion chamber 231*b*. Specifically, a valve 224*a*, a mass flow controller (MFC) 223*a*, a vaporizer 222*a*, and a raw material source 221*a* are connected to the diffusion chamber 231*a* via a pipe 225*a*. The raw material source 221*a* is, for example, a source of isocyanate, which is an example of the first monomer. The vaporizer 222*a* vaporizes isocyanate liquid supplied from the raw material source 221*a*. The MFC 223*a* controls the flow rate of the isocyanate vapor vaporized by the vaporizer 222*a*. The valve 224*a* controls supply and stop of supply of the isocyanate vapor to the pipe 225*a*.

A valve 224*b*, an MFC 223*b*, a vaporizer 222*b*, and a raw material source 221*b* are connected to the diffusion chamber 231*b* via a pipe 225*b*. The raw material source 221*b* is, for example, a source of an amine, which is an example of the second monomer. The vaporizer 222*b* vaporizes amine liquid supplied from the raw material source 221*b*. The MFC 223*b* controls the flow rate of the amine vapor vaporized by the vaporizer 222*b*. The valve 224*b* controls supply and stop of supply of the amine vapor to the pipe 225*b*.

A valve 224*c*, an MFC 223*c*, and a cleaning gas source 221*c* are connected to the shower head 230 via the pipe 225*a* and the pipe 225*b*. The cleaning gas source 221*c* is a source of a cleaning gas containing molecule including, for example, an oxygen atom or a fluorine atom. The MFC 223*c* controls the flow rate of the cleaning gas supplied from the cleaning gas source 221*c*. The valve 224*c* controls supply and stop of the cleaning gas to the pipe 225*a* and the pipe 225*b*.

The diffusion chamber 231*a* communicates with the processing space $S_P$ via ejection ports 232*a*, and the diffusion chamber 231*b* communicates with the processing space $S_P$ via ejection ports 232*b*. The isocyanate vapor and the cleaning gas supplied into the diffusion chamber 231*a* via the pipe 225*a* diffuse in the diffusion chamber 231*a* and are ejected into the processing space $S_P$ in the form of a shower through the ejection ports 232*a*. The amine vapor and the cleaning gas supplied into the diffusion chamber 231*b* via the pipe 225*b* diffuse in the diffusion chamber 231*b*, and are ejected into the processing space $S_P$ in the form of a shower through the ejection ports 232*b*. After being ejected into the processing space $S_P$ through the ejection ports 232*a* and the ejection ports 232*b*, the isocyanate vapor and the amine vapor are mixed in the processing space $S_P$ and form a polymer film having a urea bond on the surface of the substrate W placed on the stage 211.

For example, by using a diisocyanate as the first monomer and a diamine (e.g., a primary amine) as the second monomer, it is possible to produce linear polyurea. The combination of the diisocyanate and the diamine is, for example, a combination of 4,4'-diphenylmethane diisocyanate (MDI) and 1,12-diaminododecane (DAD). The combination of the diisocyanate and the diamine is, for example, a combination of 1,3-bis(isocyanatemethyl)cyclohexane (H6XDI) and 1,12-diaminododecane (DAD). The combination of the diisocyanate and the diamine is, for example, a combination of 1,3-bis(isocyanatemethyl)cyclohexane (H6XDI) and 1,3-bis(aminomethyl)cyclohexane (H6XDA). The combination of the diisocyanate and the diamine is, for example, a combination of 1,3-bis(isocyanatemethyl)cyclohexane (H6XDI) and hexamethylenediamine (HMDA). The combination of the diisocyanate and the diamine is, for example, a combination of m-xylylenediisocyanate (XDI) and m-xylylenediamine (XDA). The combination of the diisocyanate and the diamine is, for example, a combination of m-xylylene diisocyanate (XDI) and benzylamine (BA).

For example, by using the diisocyanate as the first monomer and the triamine (e.g., a primary amine) or a tetraamine (e.g., a secondary amine) as the second monomer, it is possible to produce crosslinkable polyurea. Further, by using a monoisocyanate as the first monomer and a diamine (e.g., a primary amine) as the second monomer, it is possible to produce a trimmer having a urea bond. Further, by using a monoisocyanate as the first monomer and a monoamine (e.g., a primary amine) as the second monomer, it is possible to produce a dimer having a urea bond.

An RF power supply 260 for supplying radio frequency (RF) power for plasma generation is connected to the shower head 230 via a matcher 261. The shower head 230 functions as a cathode electrode with respect to the stage 211. In cleaning the interior of the processing space $S_P$, a cleaning gas is supplied from the gas supplier 220 into the processing space $S_P$ via the shower head 230, and RF power is supplied from the RF power supply 260 into the processing space $S_P$ via the matcher 261. As a result, the cleaning gas is turned into plasma in the processing space $S_P$, and active species contained in the plasma clean the interior of the processing space $S_P$.

The controller 100 includes memory, a processor, and an input/output interface. A control program, a processing recipe, and the like are stored in the memory. The processor reads a control program from the memory and executes the control program, and controls each part of the apparatus main body 200 via the input/output interface based on the recipe or the like stored in the memory.

[Structure near Peripheral Edge of Stage 211]

Figure 2:
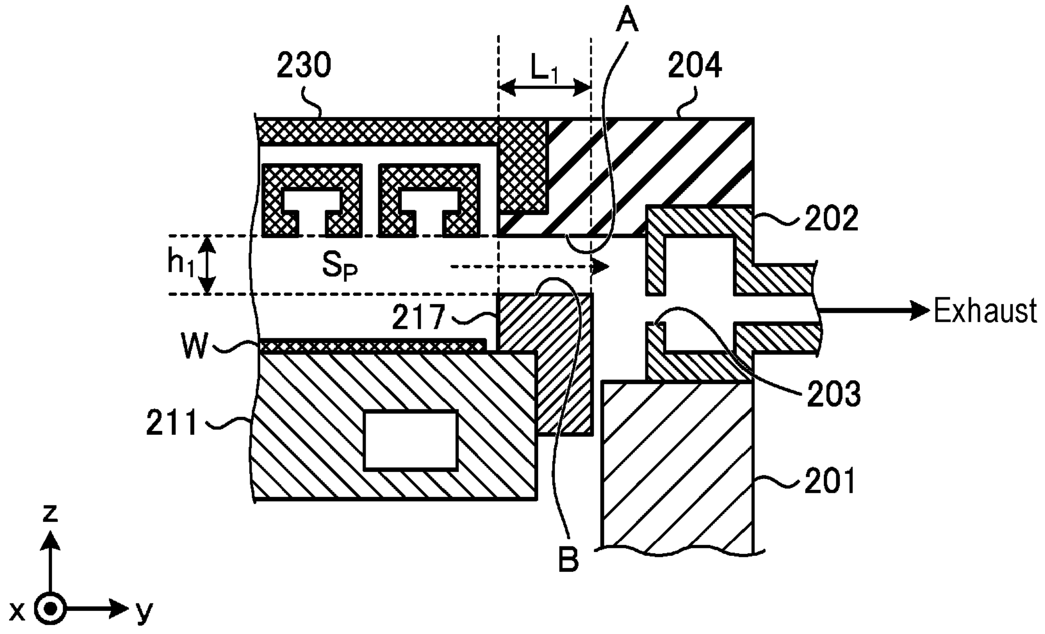
FIG. 2 is a view illustrating an example of a structure near a peripheral edge of the stage.

FIG. 2 is a view illustrating an example of a structure near the peripheral edge of the stage 211. An annular cover member 217 is installed outside a region on which a substrate W is placed in the stage 211. In the present embodiment, the cover member 217 protrudes from the peripheral edge of the stage 211 in the direction from the stage 211 toward the shower head 230. When the stage 211 is raised by driving the lifting mechanism 240, the distance $h_1$ between the top surface B of the cover member 217 and the bottom surface A of the insulating member 204 becomes smaller within the range of the distance $L_1$ of the top surface B of the cover member 217. This reduces the conductance between the processing space $S_P$ and the exhaust port 203. In the present embodiment, at the time of film forming process on a substrate W, the distance $L_1$ is set to, for example, 20 mm, and the distance $h_1$ is set to, for example, 10 mm.

Here, when the exhaust amount of gas from the exhaust port 203 is adjusted by adjusting the width of the opening of the exhaust port 203, the size of the opening of the exhaust port 203 may deviate from a design value due to a manufacturing error, an assembly error, thermal expansion, and the like. Even when the size of the opening of the exhaust port 203 changes slightly, the amount of gas exhausted from the exhaust port 203 may change greatly. Therefore, it is difficult to accurately adjust the size of the opening of the exhaust port 203 to the size as designed.

Therefore, in the present embodiment, it is possible to adjust the conductance between the top surface B of the cover member 217 and the bottom surface A of the insulating member 204 with high accuracy by driving the lifting mechanism 240. This makes it possible to suppress the amount of gas exhausted from the exhaust port 203 to a low level so that the bias of the exhausted amount of gas can be suppressed in the circumferential direction of the substrate W.

In addition, when the width of the opening of the exhaust port 203 is adjusted to be fixed, it is difficult to increase the amount of gas exhausted at the time of replacing the gas in the processing container 209 or the like. As a result, since it takes time to replace the gas in the processing container 209, it becomes difficult to improve the processing throughput. In the present embodiment, by driving the lifting mechanism 240 to lower the stage 211, the conductance between the top surface B of the cover member 217 and the bottom surface A of the insulating member 204 can be easily increased. This makes it possible to reduce the time required for replacing the gas in the processing container 209 so that the processing throughput can be improved.

In the present embodiment, the cover member 217 and the stage 211 are configured as separate members, but as another embodiment, the cover member 217 may be integrally configured with the stage 211 as a portion of the stage 211.

The cover member 217 is an example of the peripheral edge portion. The insulating member 204 is an example of the facing member.

An embodiment has been described above. As described above, the substrate processing apparatus 10 in the present embodiment includes a processing container 209, a stage 211, a shower head 230, a lifting mechanism 240, an exhaust port 203, and a controller 100. The stage 211 is provided in the processing container 209, and a substrate W is placed thereon. The shower head 230 is provided at a position facing the stage 211 in the processing container 209. The lifting mechanism 240 raises and lowers the stage. The exhaust port 203 is provided in the side wall of the processing container 209, and exhausts the gas in the processing container 209. The controller 100 controls the lifting mechanism 240 to control the distance between the cover member 217 of the stage 211 and the insulating member 204 disposed at a position facing the cover member 217 in the processing container 209. As a result, the controller 100 controls the conductance of the space between the exhaust port 203 and the processing space $S_P$ between the stage 211 and the shower head 230. This makes it possible to improve the uniformity of processing of the substrate W.

In the above-described embodiment, the ejection ports 232*a* and 232*b* through which a processing gas passes are formed in the shower head 230. As a result, it is possible to suppress the bias of the distribution of the processing gas in the processing container 209.

In the above-described embodiment, the shower head 230 supplies a first processing gas containing the first monomer and a second processing gas containing the second monomer into the processing container 209 from the different ejection ports 232*a* and 232*b*, respectively, thereby forming a polymer film of the first monomer and the second monomer on the substrate W placed on the stage 211. In addition, the first monomer is, for example, an isocyanate, the second monomer is, for example, an amine, and the polymer formed on the substrate W includes a urea bond. The film thickness of the polymer formed on the substrate W is affected by the distribution of the gas of the first monomer and the gas of the second monomer on the substrate W. In the present embodiment, since the bias of the distribution of the gas of the first monomer and the gas of the second monomer is suppressed, it is possible to form a polymer film having a urea bond with less bias in film quality and film thickness.

[Others]

The technology disclosed herein is not limited to the embodiments described above, and various modifications are possible within the scope of the gist the present disclosure.

Figure 3:
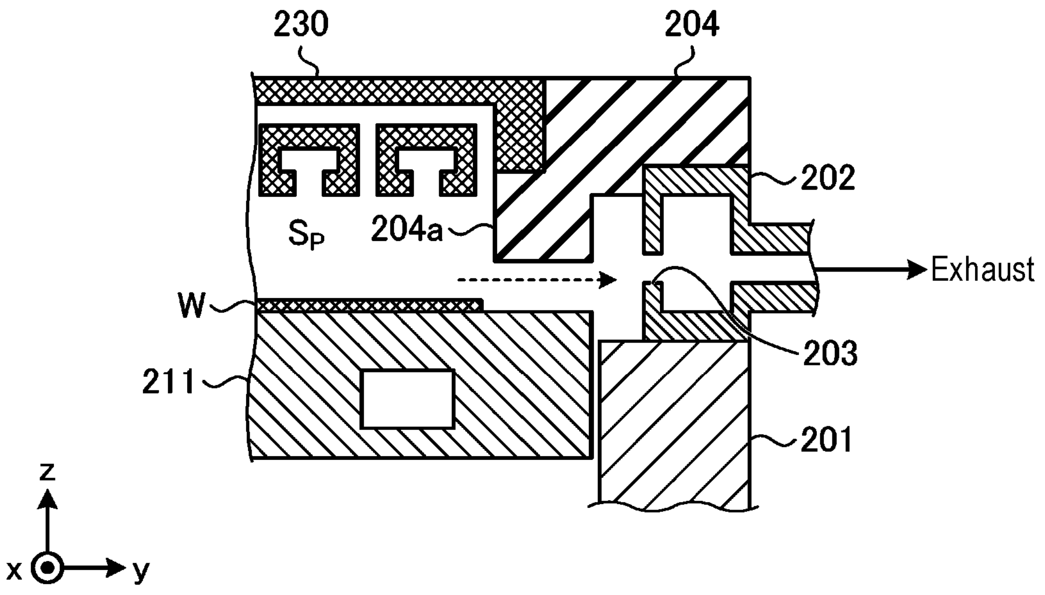
FIG. 3 is a view illustrating another example of the structure near the peripheral edge of the stage.

For example, in the example of FIG. 2, although the cover member 217 protruding from the stage 211 toward the shower head 230 is provided on the peripheral edge of the stage 211, but the disclosed technique is not limited thereto. For example, as illustrated in FIG. 3, the insulating member 204 of the portion facing the peripheral edge of the stage 211 (the ridge portion 204*a* in FIG. 3) may protrude in an annular shape from the shower head 230 toward the stage 211. In the example of FIG. 3, the cover member 217 is not provided on the peripheral edge of the stage 211. Even in such a configuration, it is possible to adjust the conductance between the processing space $S_P$ and the exhaust port 203 by driving the lifting mechanism 240.

Figure 4:
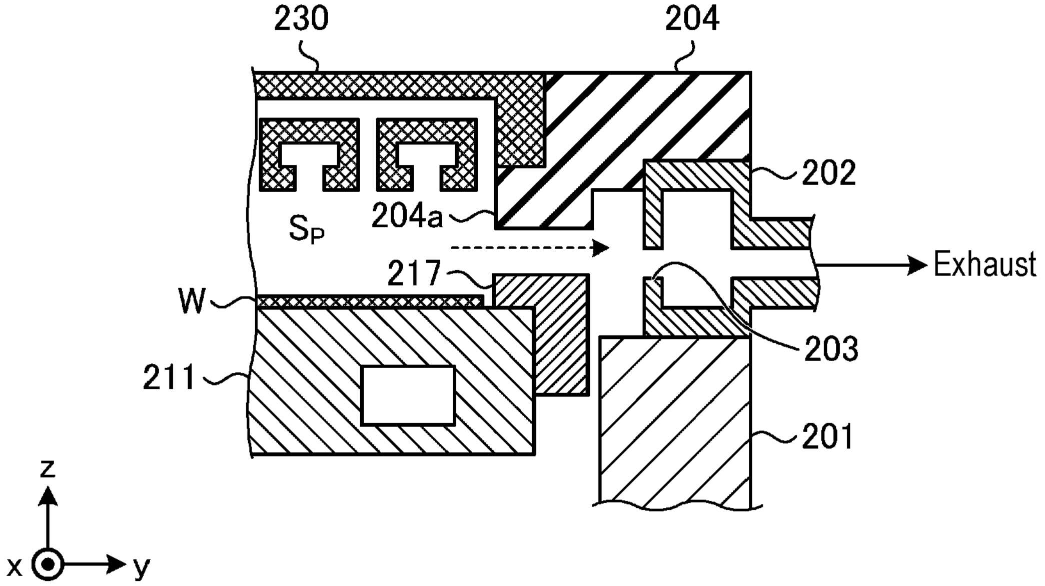
FIG. 4 is a view illustrating another example of the structure near the peripheral edge of the stage.

Alternatively, for example, as illustrated in FIG. 4, the cover member 217 is installed on the peripheral edge of the stage 211, and the insulating member 204 of the portion facing the cover member 217 (the ridge portion 204*a* in FIG. 4) may protrude in an annular shape in the direction toward the cover member 217. Even in such a configuration, it is possible to adjust the conductance between the processing space $S_P$ and the exhaust port 203 by driving the lifting mechanism 240.

Figure 5:
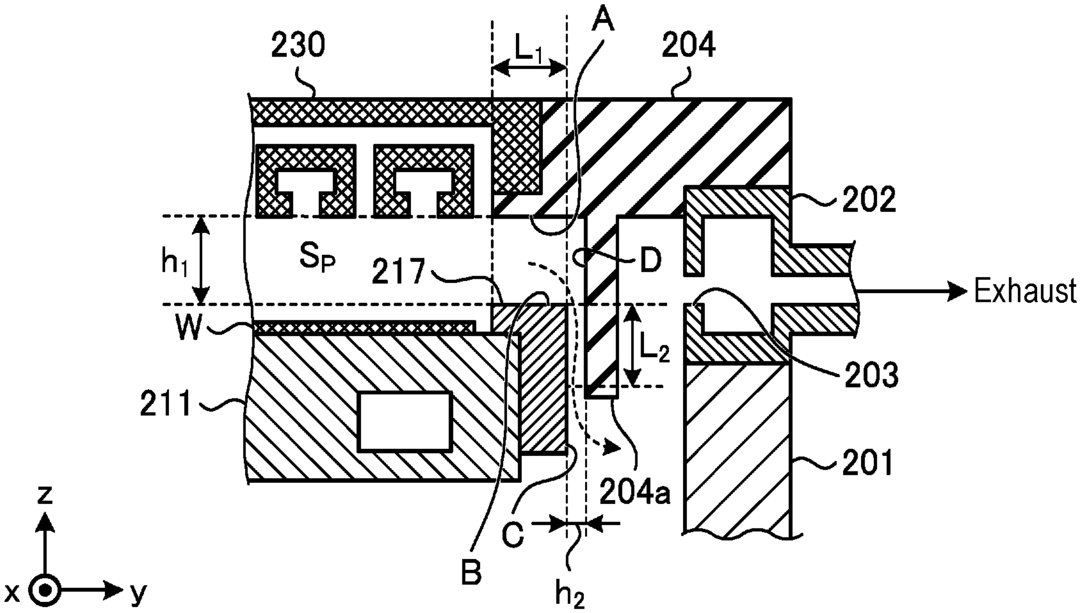
FIG. 5 is a view illustrating another example of the structure near the peripheral edge of the stage.

In addition, for example, as shown in FIG. 5, the bottom surface A of the insulating member 204 may be provided with a ridge portion 204*a* protruding in an annular shape in the direction from the shower head 230 toward the stage 211. The ridge portion 204*a* is an example of the second ridge. The ridge portion 204*a* is formed at a position where the distance between the side surface D of the ridge portion 204*a* and the side surface C of the cover member 217 is a predetermined distance $h_2$ in the y direction of FIG. 5. By driving the lifting mechanism 240, the size of the region where the side surface D of the ridge portion 204*a* and the side surface C of the cover member 217 overlap when viewed in the direction along the xy plane of FIG. 5 is controlled. The distance in the z direction in the region where the side surface D of the ridge portion 204*a* and the side surface C of the cover member 217 overlap is defined as a distance $L_2$. In the present embodiment, in the film forming process of a substrate W, the distance $h_2$ is, for example, 2 mm, and the distance $L_2$ is, for example, 5 mm to 50 mm.

When the region where the side surface D of the ridge portion 204*a* and the side surface C of the cover member 217 overlap is increased by driving the lifting mechanism 240, the conductance of the space between the side surface D of the ridge portion 204*a* and the side surface C of the cover member 217 is decreased. When the region where the side surface D of the ridge portion 204*a* and the side surface C of the cover member 217 overlap is decreased by driving the lifting mechanism 240, the conductance of the space between the side surface D of the ridge portion 204*a* and the side surface C of the cover member 217 is increased. Therefore, even in such a configuration, it is possible to adjust the conductance between the processing space $S_P$ and the exhaust port 203 by driving the lifting mechanism 240.

Figure 6:
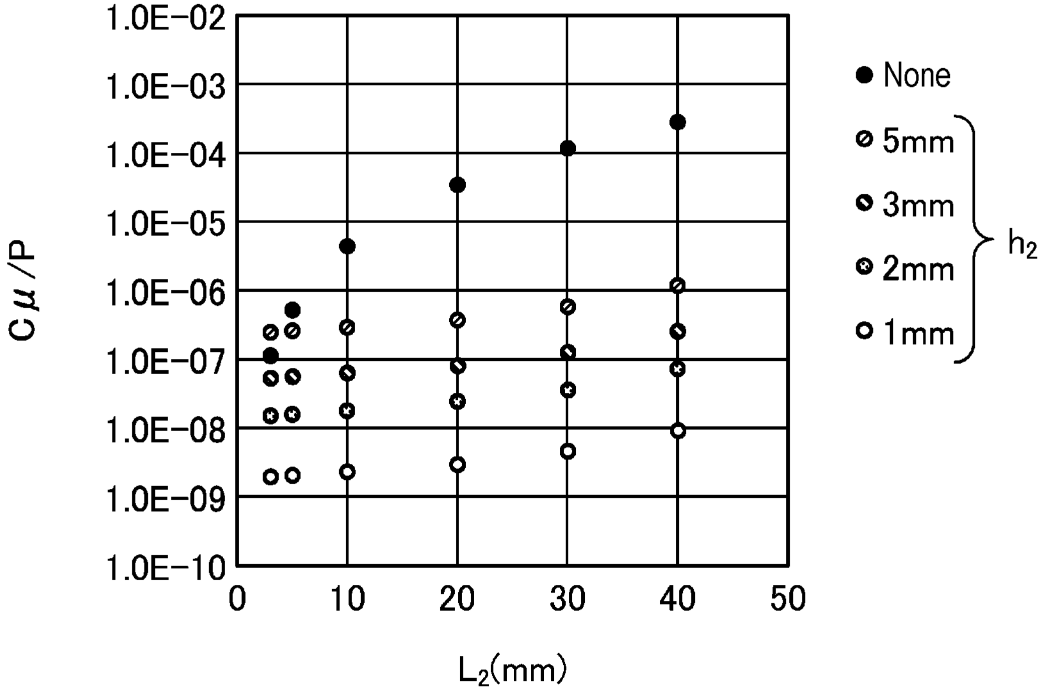
FIG. 6 is a diagram illustrating an example of the relationship between a dimension near the peripheral edge of the stage and conductance.

FIG. 6 is a diagram illustrating an example of the relationship between a dimension in a vicinity of the peripheral edge of the stage 211 and conductance. In FIG. 6, in the configuration exemplified in FIG. 5, it is assumed that the distance $L_2$ is longer than the distance $L_1$ and the distance $h_1$ is twice or more of the distance $h_2$. In FIG. 6, "none" means the case where the ridge portion 204*a* is not provided. The vertical axis of FIG. 6 represents a value calculated by Equation 1 below.

[Equation 1]

$$C\mu/P = \frac{bh_2^3}{12L_2} \tag{1}$$

In Equation 1 above, C is conductance, μ is viscosity of fluid, P is pressure, and b is a constant.

Referring to FIG. 6, in the range where the distance $L_2$ is 10 mm or more, the value of Cμ/P increases substantially linearly with the increase of the distance $L_2$ at any distance $h_2$. In the range where the distance $L_2$ is less than 10 mm, the change in the value of Cμ/P is larger in the case where the ridge portion 204*a* is not provided than in the case where the ridge portion 204*a* is provided. That is, in the range where the distance $L_2$ is less than 10 mm, the influence of conductance between the top surface B of the cover member 217 and the bottom surface A of the insulating member 204 is increased, and the influence of conductance between the side surface C of the cover member 217 and the side surface D of the ridge portion 204*a* is decreased. Accordingly, in the range where the distance $L_2$ is 10 mm or more, it is possible to adjust the conductance between the processing space $S_P$ and the exhaust port 203 with higher accuracy by controlling the distance $L_2$ and the distance $h_2$ by driving the lifting mechanism 240.

Figure 7:
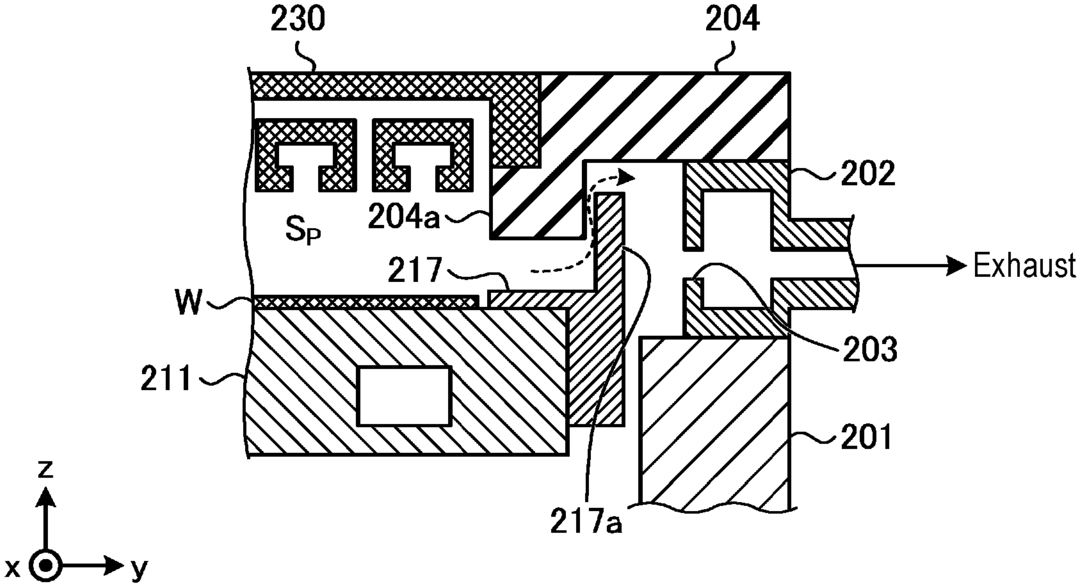
FIG. 7 is a view illustrating another example of the structure near the peripheral edge of the stage.

In FIG. 5, the size of the region where the side surface D of the ridge portion 204*a* and the side surface C of the cover member 217 overlap is controlled by driving the lifting mechanism 240, but the technique disclosed herein is not limited thereto. For example, as illustrated in FIG. 7, the cover member 217 may be provided with a ridge portion 217*a* protruding in an annular shape in the direction from the stage 211 toward the shower head 230. The ridge portion 217*a* is an example of the first ridge. The lower surface of the insulating member 204 may include a ridge portion 204*a* protruding in an annular shape in the direction from the shower head 230 toward the stage 211. By driving the lifting mechanism 240, the size of the region where the side surface of the ridge portion 204*a* and the side surface of the ridge portion 217*a* overlap when viewed in the direction along the xy plane of FIG. 7 is controlled. Even in such a configuration, it is possible to adjust the conductance between the processing space $S_P$ and the exhaust port 203.

Figure 8:
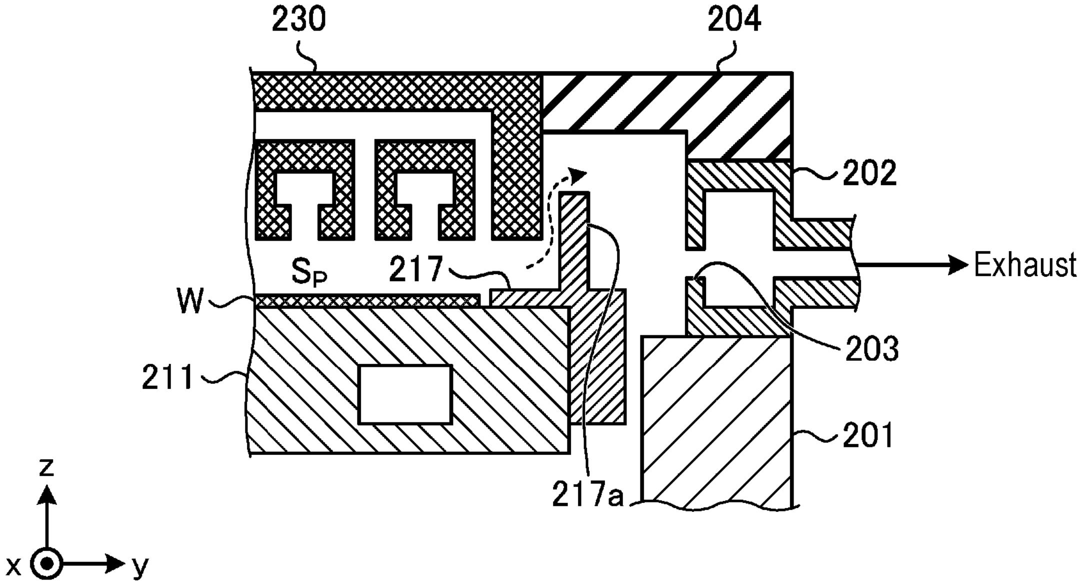
FIG. 8 is a cross-sectional view another example of the structure near the peripheral edge of the stage.

In the example of FIG. 7, the size of the region where the side surface of the ridge portion 204*a* and the side surface of the cover member 217 overlap is controlled. However, for example, as illustrated in FIG. 8, the size of the region where the side surface of the shower head 230 and the side surface of the cover member 217 overlap may be controlled. Even in such a configuration, it is possible to adjust the conductance between the processing space $S_P$ and the exhaust port 203.

Figure 9:
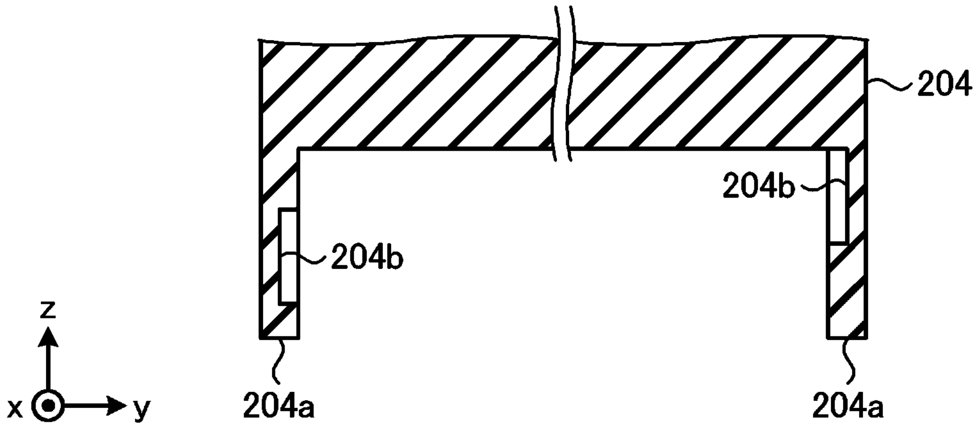
FIG. 9 is a cross-sectional view illustrating another example of the structure of the insulating member.
Figure 10:
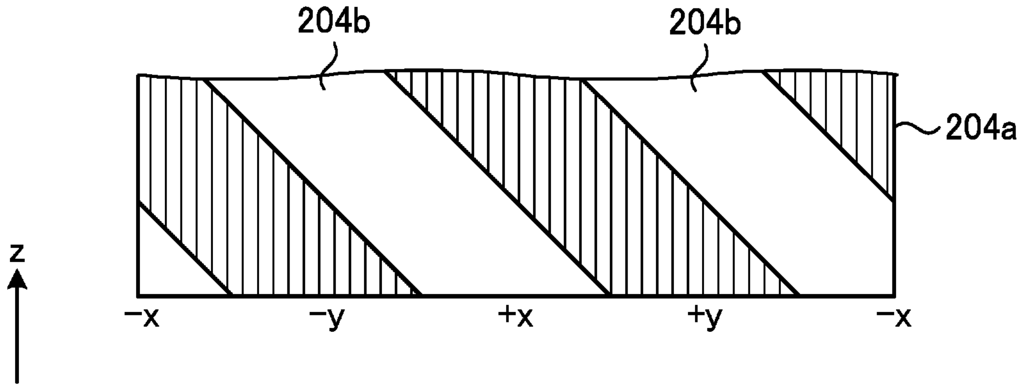
FIG. 10 is a view illustrating another example of the structure of a side surface of a ridge portion of the insulating member.

In the example of FIG. 5, the side surface of the ridge portion 204*a* on the cover member 217 side is flat, but the disclosed technique is not limited thereto. As another example, a spiral groove 204*b* may be formed on the side surface of the ridge portion 204*a* on the cover member 217 side, for example, as illustrated in FIG. 9. When the side surface of the ridge portion 204*a* is expanded in the direction along the side surface of the ridge portion 204*a* on the cover member 217 side, for example, FIG. 10 is obtained.

Figure 11:
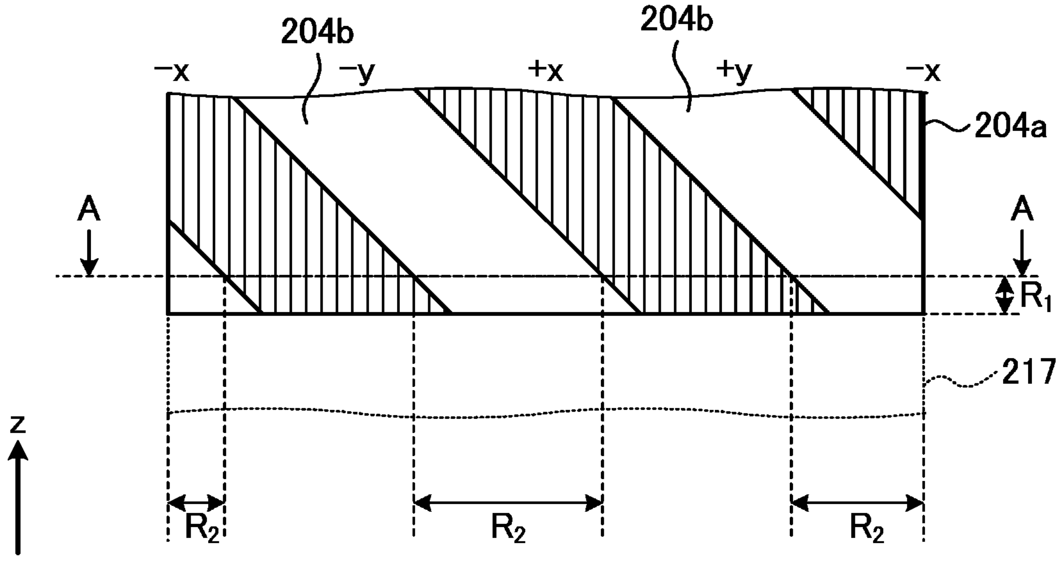
FIG. 11 is a view illustrating an example of a region where the ridge portion of the insulating member and a ridge portion of a cover member overlap in the direction along the xy plane.

The case where the cover member 217 is raised by driving the lifting mechanism 240 and, for example, as illustrated in FIG. 11, the overlapping range between the cover member 217 and the ridge portion 204*a* in the z direction becomes $R_1$ is considered. In this case, the range of the groove 204*b* in the cross section in the direction along the xy plane at the upper end of the cover member 217 (the cross section taken along line A-A in FIG. 11) is $R_2$. When the cover member 217 and the ridge portion 204*a* overlap, the gas in the processing space $S_P$ is also exhausted from the groove 204*b* in the range $R_2$ at the upper end of the cover member 217 in addition to the gap between the side surface of the cover member 217 and the side surface of the ridge portion 204*a*.

Figure 12:
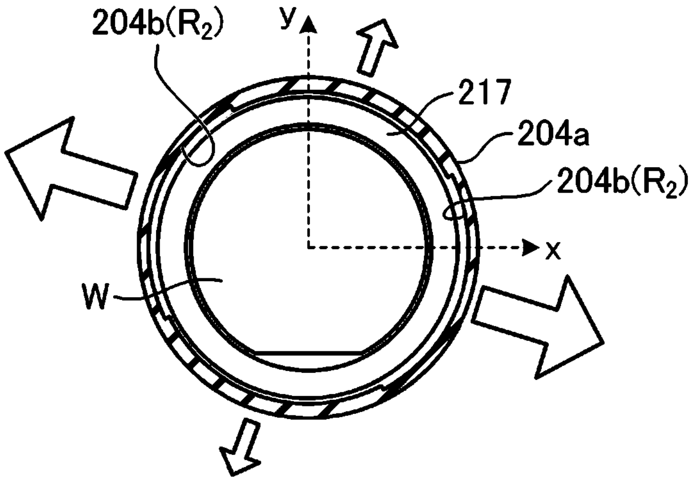
FIG. 12 is a view illustrating an example of a bias in exhaust amount in the circumferential direction of a substrate.

Therefore, in the circumferential direction of the substrate W, for example, as illustrated in FIG. 12, the exhaust amount from the portion of the groove 204*b* in the range $R_2$ is increased. FIG. 12 shows a cross section taken along line A-A of FIG. 11. In FIG. 12, the levels of the exhaust amounts are represented by the thicknesses of arrows.

Figure 13:
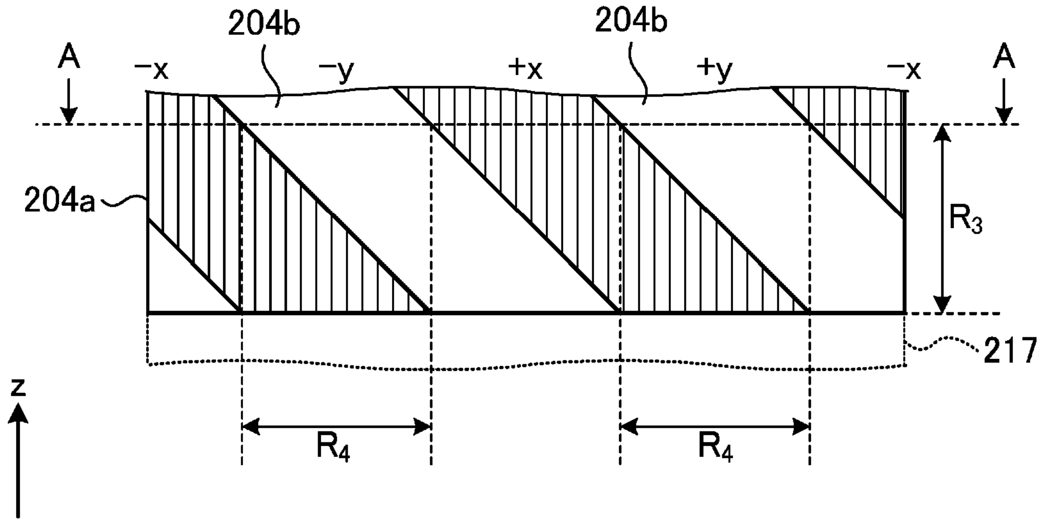
FIG. 13 is a view illustrating an example of a region where the ridge portion of the insulating member and the ridge portion of the cover member overlap in the direction along the xy plane.
Figure 14:
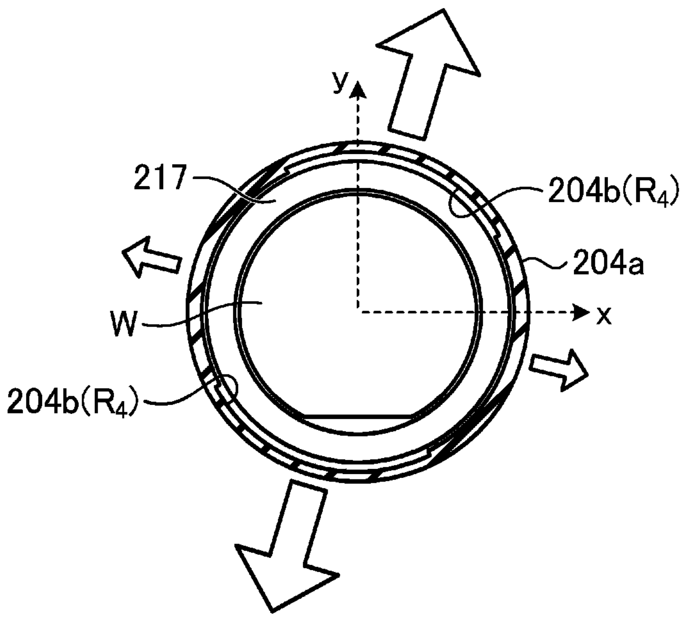
FIG. 14 is a view illustrating an example of a bias in exhaust amount in the circumferential direction of a substrate.

The case where the cover member 217 is further raised by driving the lifting mechanism 240 and, for example, as illustrated in FIG. 13, the overlapping range between the cover member 217 and the ridge portion 204*a* in the z direction becomes $R_3$ is considered. In this case, the range of the groove 204*b* in the cross section in the direction along the xy plane at the upper end of the cover member 217 (the cross section taken along line A-A in FIG. 13) is $R_4$. Therefore, in the circumferential direction of the substrate W, for example, as illustrated in FIG. 14, the exhaust amount from the portion of the groove 204*b* in the range $R_4$ is increased. FIG. 14 shows a cross section taken along line A-A of FIG. 13. In FIG. 14, the levels of the exhaust amounts are represented by the thicknesses of arrows.

As described above, by forming the spiral groove 204*b* on the side surface of the ridge portion 204*a* on the cover member 217 side, it is possible to adjust not only the conductance between the processing space $S_P$ and the exhaust port 203, but also the exhaust amount in the circumferential direction of the substrate W. By adjusting the exhaust amount in the circumferential direction of the substrate W to increase the exhaust amount in the place in which the exhaust amount is small and decrease the exhaust amount in the place in which the exhaust amount is large, it is possible to suppress the bias of the exhaust amount in the circumferential direction of the substrate W.

In the example of FIGS. 9 to 14, in the configuration exemplified in FIG. 5, the spiral groove 204*b* is formed on the side surface of the ridge portion 204*a* on the cover member 217 side, but in the configuration exemplified in FIG. 7, the spiral groove 204*b* may be formed on the side surface of the ridge portion 217*a* on the ridge portion 204*a* side. In addition, in the configuration exemplified in FIG. 8, the spiral groove 204*b* may be formed on the side surface of the ridge portion 217*a* on the shower head 230 side. In the configuration exemplified in FIG. 5, the spiral groove 204*b* may be formed on the side surface of the cover member 217 on the ridge portion 204*a* side. In the configuration exemplified in FIG. 7, the spiral groove 204*b* may be formed on the side surface of the ridge portion 204*a* on the ridge portion 217*a* side. In the configuration exemplified in FIG. 8, the spiral groove 204*b* may be formed on the side surface of the shower head 230 on the ridge portion 217*a* side.

Figure 15:
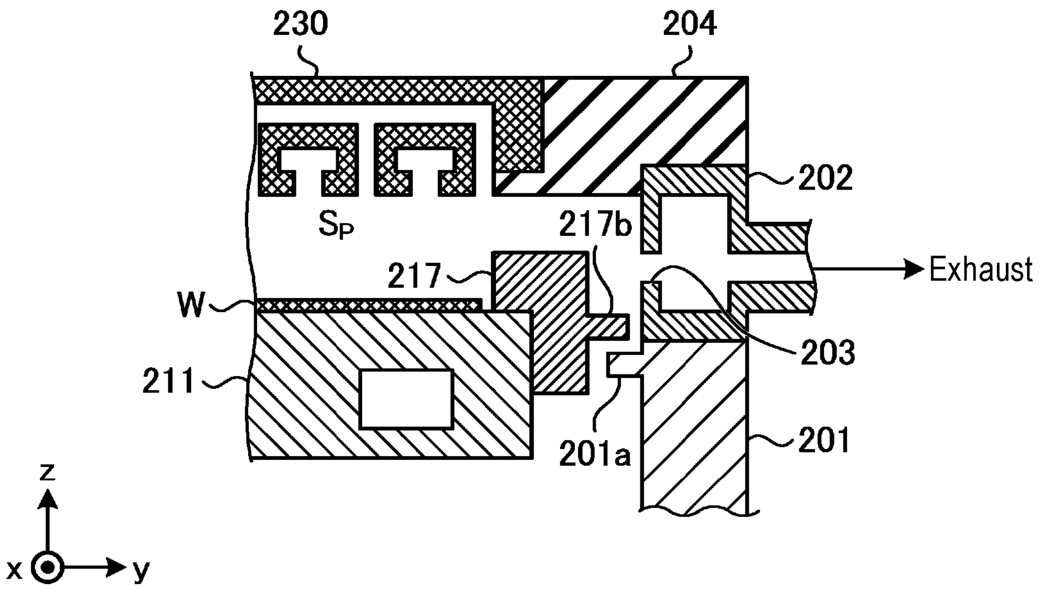
FIG. 15 is a view illustrating another example of the structure near the peripheral edge of the stage.
Figure 16:
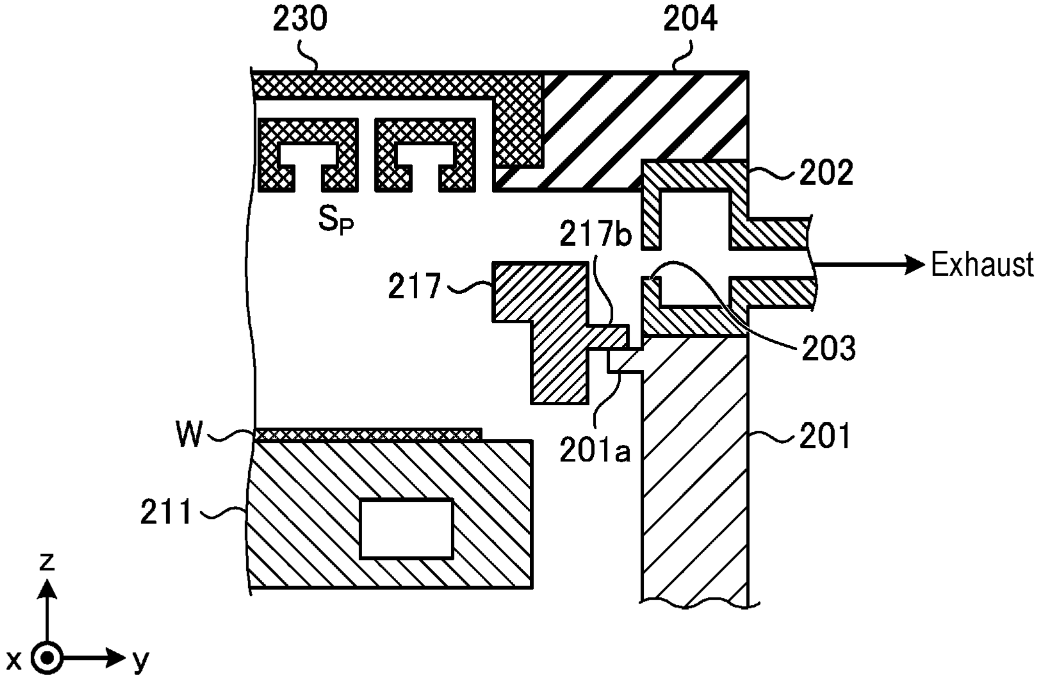
FIG. 16 is a view illustrating an example of the positions of the stage and the cover member during cleaning.

For example, as illustrated in FIG. 15, the side surface of the cover member 217 exemplified in FIG. 2 may include a protrusion 217*b* protruding to the side opposite to the stage 211, and the inner side surface of the lower container 201 may include a protrusion 201*a* protruding inside the processing container 209. The protrusion 217*b* is an example of the first protrusion, and the protrusion 201*a* is an example of the second protrusion. When the cleaning of the processing container 209 is performed, the controller 100 lowers the stage 211 by the lifting mechanism 240, and places the protrusion 217*b* on the protrusion 201*a*. For example, as illustrated in FIG. 16, after separating the stage 211 and the cover member 217 away from each other, the cleaning of the processing container 209 is performed. This makes it possible to efficiently remove by cleaning the reaction by-products (so-called deposits) that have entered the space between the cover member 217 and the stage 211 at the time of film formation on the substrate W.

Figure 17A:
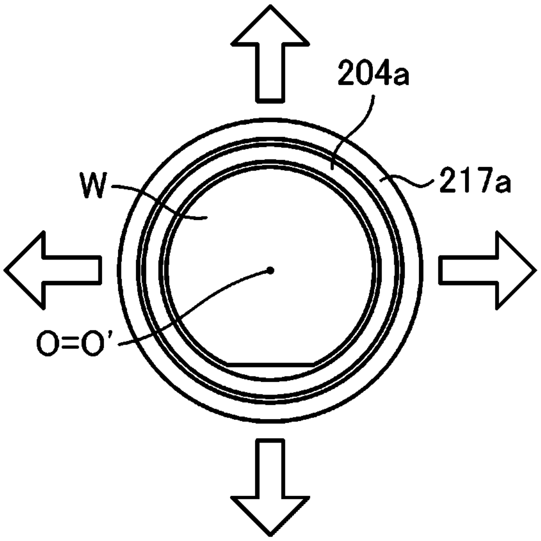
FIGS. 17A and 17B are views illustrating an example of the positional relationship between the ridge portion of the insulating member and the ridge portion of the cover member.

In the cover member 217 illustrated in FIG. 7, for example, as illustrated in FIG. 17A, when the center O' of the cover member 217 and the center O of the ridge portion 204*a* are aligned with each other, the width between the ridge portion 204*a* and the ridge portion 217*a* becomes substantially uniform. This makes it possible to make the exhaust amount substantially uniform in the circumferential direction of the substrate W.

Figure 17B:
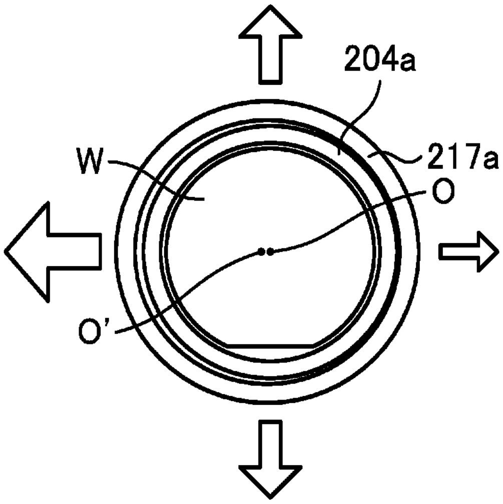

As illustrated in FIG. 17B, for example, when the cover member 217 is intentionally disposed on the stage 211 so that the center O' of the cover member 217 and the center O of the ridge portion 204*a* do not coincide with each other, the width between the ridge portion 204*a* and the ridge portion 217*a* becomes non-uniform. As a result, in the circumferential direction of the substrate W, a portion in which the width between the ridge portion 204*a* and the ridge portion 217*a* is relatively wide and a portion in which the width is relatively narrow are generated. By disposing the cover member 217 on the stage 211 such that the center O' of the cover member 217 deviates from the center O of the ridge portion 204*a*, it is possible to intentionally generate a bias in the exhaust amount in the circumferential direction of the substrate W, for example, as illustrated in FIG. 17B. The position of the cover member 217 with respect to the stage 211 may be adjusted when the cover member 217 is placed on the stage 211 by, for example, a transport robot that transports the cover member 217. This makes it possible to adjust the exhaust amount in the circumferential direction of the substrate W to increase the exhaust amount in the place in which the exhaust amount is small and decrease the exhaust amount in the place in which the exhaust amount is large, so that the bias of the exhaust amount in the circumferential direction of the substrate W can be suppressed.

Figure 18:
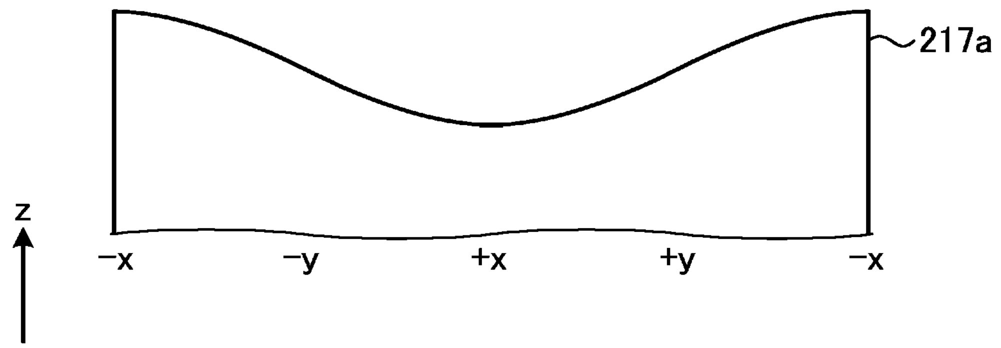
FIG. 18 is a view illustrating another example of the shape of the ridge portion of the cover member.

In addition, the height of the ridge portion 217*a* in the cover member 217 exemplified in FIG. 7 is almost constant, but the disclosed technique is not limited thereto. The ridge portion 217*a* may have a different height depending on the position in the circumferential direction, for example, as illustrated in FIG. 18. For example, the cover member 217 is disposed on the stage 211 in an orientation in which the height of the ridge portion 217*a* in a direction where the exhaust amount is desired to be increased is low, and the height of the ridge portion 217*a* in a direction in which the exhaust amount is desired to be increased is high. This makes it possible to intentionally generate a bias in the exhaust amount in the circumferential direction of the substrate W. The orientation of the cover member 217 with respect to the stage 211 is adjusted when the cover member 217 is placed on the stage 211 by, for example, a transport robot that transports the cover member 217. This makes it possible to adjust the exhaust amount in the circumferential direction of the substrate W to increase the exhaust amount in the place in which the exhaust amount is small and decrease the exhaust amount in the place in which the exhaust amount is large, so that the bias of the exhaust amount in the circumferential direction of the substrate W can be suppressed.

The configurations exemplified in FIGS. 9 to 14, the configurations exemplified in FIGS. 17A and 17B, and the configuration exemplified in FIG. 18 may be used in combination.

In the above-described embodiments, an isocyanate is used as the first monomer and an amine is used as the second monomer to form a polymer film having a urea bond (—NH—CO—NH—) on the surface of the substrate W, but the technique disclosed herein is not limited thereto. For example, a polymer film having a 2-aminoethanol bond (—NH—$CH_2$—CH(OH)—) may be formed on the surface of the substrate W by using an epoxide as the first monomer and an amine as the second monomer. Alternatively, a polymer film having a urethane bond (—NH—CO—O—) may be formed on the surface of the substrate W by using an isocyanate as the first monomer and an alcohol as the second monomer. Alternatively, a polymer film having an amide bond (—NH—CO—) may be formed on the surface of the substrate W by using an acyl halide as the first monomer and an amine as the second monomer. Alternatively, a polymer film having an imide bond (—CO—N(–)—CO—) may be formed on the surface of the substrate W by using a carboxylic acid anhydride as the first monomer and an amine as the second monomer.

When a film of a polymer having an imide bond is formed on the surface of the substrate W, as the first monomer, for example, a pyromellitic acid dianhydride (PMDA) may be used, and as the second monomer, for example, a 4,4'-oxydianiline (44ODA) or a hexamethylenediamine (HMDA) may be used.

In the above-described embodiments, an apparatus for performing film formation is described as an example of the substrate processing apparatus 10, but the technique disclosed herein is not limited thereto. In addition to the apparatus for performing film formation, the technique disclosed herein is applicable to an apparatus for performing etching, an apparatus for performing modification of a substrate W, or the like if the apparatus is an apparatus in which the distribution of gas within a processing container 209 affects the quality of processing of the substrate W.

It shall be understood that the embodiments disclosed herein are examples in all respects and are not restrictive. Indeed, the above-described embodiments can be implemented in various forms. The above-described embodiments may be omitted, replaced, or modified in various forms without departing from the scope and spirit of the appended claims.

According to various aspects and embodiments of the present disclosure, it is possible to improve the uniformity of processing on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:

a processing container;

a stage installed in the processing container and configured to place a substrate thereon, the stage having a peripheral edge portion;

a ceiling plate installed at a position facing the stage in the processing container;

a driver configured to raise and lower the stage;

an exhaust port formed in a side wall of the processing container and configured to exhaust a gas in the processing container;

a controller configured to control an exhaust conductance of a space between the exhaust port and a processing space between the stage and the ceiling plate; and a facing member disposed at a position facing the peripheral edge portion in the processing container, wherein the facing member includes a second ridge that is disposed in an annular shape on a bottom surface of the ceiling plate to surround the peripheral edge portion of the stage when viewed in a direction from the ceiling plate toward the stage and protrudes in a direction from the ceiling plate toward the stage, wherein a gap having a predetermined distance is formed between a side surface of the second ridge and a side surface of the peripheral edge portion, wherein the controller is configured to control the exhaust conductance by controlling the driver to adjust a size of a region where the side surface of the second ridge and the side surface of the peripheral edge portion overlap when viewed in a direction intersecting the direction from the ceiling plate toward the stage, wherein a first spiral groove is formed on the side surface of the second ridge facing the side surface of the peripheral edge portion, wherein the peripheral edge portion includes a first ridge that is disposed in an annular shape on a peripheral edge of a top surface of the stage to surround a region in which the substrate is placed on the stage and protrudes in a direction from the stage toward the ceiling plate, wherein a gap having a predetermined distance is formed between a side surface of the first ridge and a side surface of the facing member, and wherein a second spiral groove is formed on the side surface of the first ridge facing the side surface of the facing member.

2. The substrate processing apparatus of claim 1, wherein the controller is configured to control the exhaust conductance by controlling the driver to adjust a size of a region where the side surface of the first ridge and the side surface of the second ridge overlap when viewed in a direction intersecting the direction from the ceiling plate toward the stage.

3. The substrate processing apparatus of claim 2, wherein the peripheral edge portion is an annular member placed on the peripheral edge of the stage, wherein a side wall of the peripheral edge portion includes a first protrusion that protrudes to a side opposite to the stage, wherein an inner side wall of the processing container includes a second protrusion that protrudes inside the processing container, and wherein the controller is configured to execute a cleaning of the processing container after separating the stage and the peripheral edge portion away from each other by lowering the stage by the driver so that the first protrusion is placed on the second protrusion.

4. The substrate processing apparatus of claim 3, wherein ejection ports through which a processing gas passes are formed in the ceiling plate.

5. The substrate processing apparatus of claim 4, wherein the ceiling plate is configured to supply a first processing gas containing a first monomer and a second processing gas containing a second monomer into the processing container from different ejection ports, respectively, so as to form a film of a polymer of the first monomer and the second monomer on the substrate placed on the stage.

6. The substrate processing apparatus of claim 5, wherein the first monomer is an isocyanate, wherein the second monomer is an amine, and wherein the polymer formed on the substrate includes a urea bond.

7. The substrate processing apparatus of claim 5, wherein the first monomer is a carboxylic acid anhydride, wherein the second monomer is an amine, and wherein the polymer formed on the substrate includes an imide bond.

8. The substrate processing apparatus of claim 5, wherein the first monomer is an epoxide, wherein the second monomer is an amine, and wherein the polymer formed on the substrate includes a 2-aminoethanol bond.

9. The substrate processing apparatus of claim 5, wherein the first monomer is an isocyanate, wherein the second monomer is an alcohol, and wherein the polymer formed on the substrate includes a urethane bond.

10. The substrate processing apparatus of claim 5, wherein the first monomer is an acyl halide, wherein the second monomer is an amine, and wherein the polymer formed on the substrate includes an amide bond.

11. The substrate processing apparatus of claim 1, wherein a side wall of the peripheral edge portion includes a first protrusion that protrudes to a side opposite to the stage, wherein an inner side wall of the processing container includes a second protrusion that protrudes inside the processing container, and wherein the controller is configured to execute a cleaning of the processing container after separating the stage and the peripheral edge portion away from each other by lowering the stage by the driver so that the first protrusion is placed on the second protrusion.

12. The substrate processing apparatus of claim 1, wherein ejection ports through which a processing gas passes are formed in the ceiling plate.

* * * * *